US008463218B2

(12) United States Patent
McKinzie, III et al.

(10) Patent No.: US 8,463,218 B2
(45) Date of Patent: *Jun. 11, 2013

(54) ADAPTIVE MATCHING NETWORK

(75) Inventors: William E. McKinzie, III, Fulton, MD (US); Heinz Bachmann, Stow, MA (US); Greg Mendolia, Nashua, NH (US)

(73) Assignee: Research In Motion RF, Inc., Wilmington, DE (US)

( * ) Notice: Subject to any disclaimer, the term of this patent is extended or adjusted under 35 U.S.C. 154(b) by 540 days.

This patent is subject to a terminal disclaimer.

(21) Appl. No.: 12/718,615

(22) Filed: Mar. 5, 2010

(65) Prior Publication Data
US 2010/0156552 A1    Jun. 24, 2010

Related U.S. Application Data

(63) Continuation of application No. 11/653,639, filed on Jan. 16, 2007, now Pat. No. 7,711,337.

(60) Provisional application No. 60/758,862, filed on Jan. 14, 2006.

(51) Int. Cl.
*H04B 1/06* (2006.01)
*H04B 7/00* (2006.01)

(52) U.S. Cl.
USPC ............. 455/248.1; 455/67.14; 455/67.13; 455/77; 455/87; 455/178.1

(58) Field of Classification Search
USPC ............ 455/248.1, 67.14, 67.13, 77, 87, 455/178.1, 73, 83, 13.3, 67.11, 169.1, 182.3, 455/192.3, 197.2, 340 C, 121–125, 129; 333/133–134, 175, 178
See application file for complete search history.

(56) References Cited

U.S. PATENT DOCUMENTS

| 2,745,067 | A | 5/1956 | True |
| 3,117,279 | A | 1/1964 | Ludvigson et al. |
| 3,160,832 | A | 12/1964 | Beitman et al. |

(Continued)

FOREIGN PATENT DOCUMENTS

| DE | 19614655 | 10/1997 |
| DE | 102008050743 | 4/2010 |

(Continued)

OTHER PUBLICATIONS

Hyun, S., "Effects of strain on the dielectric properties of tunable dielectric SrTiO3 thin films", Applied Physics Letters, 2004 American Institute of Physics.

(Continued)

*Primary Examiner* — Pablo Tran
(74) *Attorney, Agent, or Firm* — Guntin & Gust, PLC; Ed Guntin

(57) ABSTRACT

A system that incorporates teachings of the present disclosure can include, for example, an apparatus having a matching network adapted to reduce a magnitude of a signal reflection at a port of the matching network. The matching network can have one or more controllable variable reactive elements. A controller can be adapted to determine reflection coefficient information from incident and reflected waves sampled at the port of the matching network, and follow at least one cycle of a coarse tune process for generating one or more control signals to tune one or more reactances of the one or more controllable variable reactive elements. Additional embodiments are disclosed.

21 Claims, 8 Drawing Sheets

U.S. PATENT DOCUMENTS

| | | |
|---|---|---|
| 3,390,337 A | 6/1968 | Beitman |
| 3,443,231 A | 5/1969 | Roza |
| 3,509,500 A | 4/1970 | Mcnair et al. |
| 3,571,716 A | 3/1971 | Hill |
| 3,590,385 A | 6/1971 | Sabo |
| 3,601,717 A | 8/1971 | Kuecken |
| 3,794,941 A | 2/1974 | Templin |
| 3,919,644 A | 11/1975 | Smolka |
| 3,990,024 A | 11/1976 | Hou |
| 3,995,237 A | 11/1976 | Brunner |
| 4,186,359 A | 1/1980 | Kaegebein |
| 4,201,960 A | 5/1980 | Skutta |
| 4,227,256 A | 10/1980 | O'Keefe |
| 4,383,441 A | 5/1983 | Willis |
| 4,476,578 A | 10/1984 | Gaudin |
| 4,493,112 A | 1/1985 | Bruene |
| 4,777,490 A | 10/1988 | Sharma |
| 4,799,066 A | 1/1989 | Deacon |
| 4,965,607 A | 10/1990 | Wilkins |
| 5,032,805 A | 7/1991 | Elmer |
| 5,142,255 A | 8/1992 | Chang |
| 5,177,670 A | 1/1993 | Shinohara |
| 5,195,045 A | 3/1993 | Keane |
| 5,200,826 A | 4/1993 | Seong |
| 5,212,463 A | 5/1993 | Babbitt |
| 5,243,358 A | 9/1993 | Sanford |
| 5,258,728 A | 11/1993 | Taniyoshi |
| 5,276,912 A | 1/1994 | Siwiak |
| 5,301,358 A | 4/1994 | Gaskill |
| 5,307,033 A | 4/1994 | Koscica |
| 5,310,358 A | 5/1994 | Johnson |
| 5,312,790 A | 5/1994 | Sengupta |
| 5,334,958 A | 8/1994 | Babbitt |
| 5,371,473 A | 12/1994 | Trinh |
| 5,409,889 A | 4/1995 | Das |
| 5,427,988 A | 6/1995 | Sengupta |
| 5,430,417 A | 7/1995 | Martin |
| 5,446,447 A | 8/1995 | Carney |
| 5,448,252 A | 9/1995 | Ali |
| 5,451,567 A | 9/1995 | Das |
| 5,451,914 A | 9/1995 | Stengel |
| 5,457,394 A | 10/1995 | McEwan |
| 5,472,935 A | 12/1995 | Yandrofski |
| 5,479,139 A | 12/1995 | Koscica |
| 5,486,491 A | 1/1996 | Sengupta |
| 5,496,795 A | 3/1996 | Das |
| 5,502,372 A | 3/1996 | Quan |
| 5,524,281 A | 6/1996 | Bradley et al. |
| 5,561,407 A | 10/1996 | Koscica |
| 5,564,086 A | 10/1996 | Cygan |
| 5,589,844 A | 12/1996 | Belcher et al. |
| 5,593,495 A | 1/1997 | Masuda |
| 5,635,433 A | 6/1997 | Sengupta |
| 5,635,434 A | 6/1997 | Sengupta |
| 5,640,042 A | 6/1997 | Koscica |
| 5,679,624 A | 10/1997 | Das |
| 5,689,219 A | 11/1997 | Piirainen |
| 5,693,429 A | 12/1997 | Sengupta |
| 5,694,134 A | 12/1997 | Barnes |
| 5,699,071 A | 12/1997 | Urakami |
| 5,766,697 A | 6/1998 | Sengupta |
| 5,777,581 A | 7/1998 | Lilly |
| 5,778,308 A | 7/1998 | Sroka |
| 5,786,727 A | 7/1998 | Sigmon |
| 5,812,943 A | 9/1998 | Suzuki |
| 5,830,591 A | 11/1998 | Sengupta |
| 5,846,893 A | 12/1998 | Sengupta |
| 5,874,926 A | 2/1999 | Tsuru |
| 5,880,635 A | 3/1999 | Satoh |
| 5,886,867 A | 3/1999 | Chivukula |
| 5,892,482 A | 4/1999 | Coleman et al. |
| 5,929,717 A | 7/1999 | Richardson |
| 5,963,871 A | 10/1999 | Zhinong |
| 5,969,582 A | 10/1999 | Boesch |
| 5,990,766 A | 11/1999 | Zhang |
| 6,009,124 A | 12/1999 | Smith |
| 6,020,787 A | 2/2000 | Kim |
| 6,029,075 A | 2/2000 | Das |
| 6,045,932 A | 4/2000 | Jia |
| 6,061,025 A | 5/2000 | Jackson |
| 6,074,971 A | 6/2000 | Chiu |
| 6,096,127 A | 8/2000 | Dimos |
| 6,100,733 A | 8/2000 | Dortu |
| 6,101,102 A | 8/2000 | Brand |
| 6,115,585 A | 9/2000 | Matero |
| 6,133,883 A | 10/2000 | Munson |
| 6,172,385 B1 | 1/2001 | Duncombe |
| 6,215,644 B1 | 4/2001 | Dhuler |
| 6,281,847 B1 | 8/2001 | Lee |
| 6,343,208 B1 | 1/2002 | Ying |
| 6,377,142 B1 | 4/2002 | Chiu |
| 6,377,217 B1 | 4/2002 | Zhu |
| 6,377,440 B1 | 4/2002 | Zhu |
| 6,384,785 B1 | 5/2002 | Kamogawa |
| 6,404,614 B1 | 6/2002 | Zhu |
| 6,408,190 B1 | 6/2002 | Ying |
| 6,414,562 B1 | 7/2002 | Bouisse |
| 6,415,562 B1 | 7/2002 | Donaghue |
| 6,452,776 B1 | 9/2002 | Chakravorty |
| 6,461,930 B2 | 10/2002 | Akram |
| 6,466,774 B1 | 10/2002 | Okabe |
| 6,492,883 B2 | 12/2002 | Liang |
| 6,514,895 B1 | 2/2003 | Chiu |
| 6,525,630 B1 | 2/2003 | Zhu |
| 6,531,936 B1 | 3/2003 | Chiu |
| 6,535,076 B2 | 3/2003 | Partridge |
| 6,535,722 B1 | 3/2003 | Rosen |
| 6,538,603 B1 | 3/2003 | Chen |
| 6,556,102 B1 | 4/2003 | Sengupta |
| 6,556,814 B1 | 4/2003 | Klomsdorf |
| 6,570,462 B2 | 5/2003 | Edmonson et al. |
| 6,590,468 B2 | 7/2003 | Du Toit |
| 6,590,541 B1 | 7/2003 | Schultze |
| 6,597,265 B2 | 7/2003 | Liang |
| 6,608,603 B2 | 8/2003 | Alexopoulos |
| 6,624,786 B2 | 9/2003 | Boyle |
| 6,657,595 B1 | 12/2003 | Phillips et al. |
| 6,661,638 B2 | 12/2003 | Jackson et al. |
| 6,670,256 B2 | 12/2003 | Yang |
| 6,710,651 B2 | 3/2004 | Forrester |
| 6,724,611 B1 | 4/2004 | Mosley |
| 6,724,890 B1 | 4/2004 | Bareis |
| 6,737,179 B2 | 5/2004 | Sengupta |
| 6,759,918 B2 | 7/2004 | Du Toit |
| 6,765,540 B2 | 7/2004 | Toncich |
| 6,768,472 B2 | 7/2004 | Alexopoulos |
| 6,774,077 B2 | 8/2004 | Sengupta |
| 6,795,712 B1 | 9/2004 | Vakilian |
| 6,825,818 B2 | 11/2004 | Toncich |
| 6,839,028 B2 | 1/2005 | Lee |
| 6,845,126 B2 | 1/2005 | Dent |
| 6,859,104 B2 | 2/2005 | Toncich |
| 6,862,432 B1 | 3/2005 | Kim |
| 6,864,757 B2 | 3/2005 | Du Toit |
| 6,868,260 B2 | 3/2005 | Jagielski |
| 6,888,714 B2 | 5/2005 | Shaw |
| 6,905,989 B2 | 6/2005 | Ellis |
| 6,907,234 B2 | 6/2005 | Karr |
| 6,920,315 B1 | 7/2005 | Wilcox |
| 6,943,078 B1 | 9/2005 | Zheng |
| 6,946,847 B2 * | 9/2005 | Nishimori et al. ............ 324/600 |
| 6,949,442 B2 | 9/2005 | Barth |
| 6,961,368 B2 | 11/2005 | Dent |
| 6,964,296 B2 | 11/2005 | Memory |
| 6,965,837 B2 | 11/2005 | Vintola |
| 6,993,297 B2 | 1/2006 | Smith |
| 7,009,455 B2 | 3/2006 | Toncich |
| 7,071,776 B2 | 7/2006 | Forrester |
| 7,107,033 B2 | 9/2006 | D du Toit |
| 7,113,614 B2 | 9/2006 | Rhoads |
| 7,151,411 B2 | 12/2006 | Martin |
| 7,176,634 B2 | 2/2007 | Kitamura |
| 7,176,845 B2 | 2/2007 | Fabrega-Sanchez |
| 7,180,467 B2 * | 2/2007 | Fabrega-Sanchez et al. . 343/861 |
| 7,221,327 B2 | 5/2007 | Toncich |
| 7,298,329 B2 | 11/2007 | Diament |
| 7,312,118 B2 | 12/2007 | Kiyotoshi |

| | | |
|---|---|---|
| 7,332,980 B2 | 2/2008 | Zhu |
| 7,332,981 B2 | 2/2008 | Matsuno |
| 7,339,527 B2 | 3/2008 | Sager |
| 7,426,373 B2 | 9/2008 | Clingman |
| 7,427,949 B2 | 9/2008 | Channabasappa et al. |
| 7,468,638 B1 | 12/2008 | Tsai |
| 7,535,080 B2 | 5/2009 | Zeng et al. |
| 7,535,312 B2 | 5/2009 | McKinzie |
| 7,539,527 B2 | 5/2009 | Jang |
| 7,596,357 B2 | 9/2009 | Nakamata |
| 7,633,355 B2 | 12/2009 | Matsuo |
| 7,667,663 B2 | 2/2010 | Hsiao |
| 7,768,400 B2 | 8/2010 | Lawrence et al. |
| 7,786,819 B2 | 8/2010 | Ella |
| 7,865,154 B2 * | 1/2011 | Mendolia et al. ............. 455/125 |
| 7,917,104 B2 | 3/2011 | Manssen et al. |
| 7,991,363 B2 | 8/2011 | Greene |
| 8,112,043 B2 * | 2/2012 | Knudsen et al. ........... 455/67.14 |
| 8,170,510 B2 | 5/2012 | Knudsen et al. |
| 8,190,109 B2 * | 5/2012 | Ali et al. ........................ 455/123 |
| 8,217,732 B2 * | 7/2012 | McKinzie, III ............. 333/17.3 |
| 2002/0030566 A1 | 3/2002 | Bozler |
| 2002/0109642 A1 | 8/2002 | Gee et al. |
| 2002/0118075 A1 | 8/2002 | Ohwada |
| 2002/0145483 A1 | 10/2002 | Bouisse |
| 2002/0167963 A1 | 11/2002 | Joa-Ng |
| 2002/0187780 A1 | 12/2002 | Souissi |
| 2002/0191703 A1 | 12/2002 | Ling |
| 2002/0193088 A1 * | 12/2002 | Jung ........................... 455/191.2 |
| 2003/0060227 A1 | 3/2003 | Sekine |
| 2003/0071300 A1 | 4/2003 | Yashima |
| 2003/0114124 A1 | 6/2003 | Higuchi |
| 2003/0142022 A1 | 7/2003 | Ollikainen |
| 2003/0193997 A1 | 10/2003 | Dent |
| 2003/0199286 A1 | 10/2003 | D du Toit |
| 2003/0210206 A1 | 11/2003 | Phillips |
| 2003/0232607 A1 | 12/2003 | Le Bars |
| 2004/0009754 A1 * | 1/2004 | Smith, Jr. ........................ 455/82 |
| 2004/0090372 A1 | 5/2004 | Nallo |
| 2004/0100341 A1 | 5/2004 | Luetzelschwab |
| 2004/0127178 A1 | 7/2004 | Kuffner |
| 2004/0137950 A1 | 7/2004 | Bolin |
| 2004/0202399 A1 | 10/2004 | Kochergin |
| 2004/0257293 A1 | 12/2004 | Friedrich |
| 2005/0007291 A1 | 1/2005 | Fabrega-Sanchez |
| 2005/0032488 A1 | 2/2005 | Pehlke |
| 2005/0042994 A1 | 2/2005 | Otaka |
| 2005/0059362 A1 | 3/2005 | Kalajo |
| 2005/0082636 A1 | 4/2005 | Yashima |
| 2005/0085204 A1 | 4/2005 | Poilasne et al. |
| 2005/0093624 A1 * | 5/2005 | Forrester et al. ............. 330/129 |
| 2005/0130608 A1 | 6/2005 | Forse |
| 2005/0130699 A1 | 6/2005 | Kim |
| 2005/0215204 A1 | 9/2005 | Wallace |
| 2005/0264455 A1 | 12/2005 | Talvitie |
| 2005/0282503 A1 | 12/2005 | Onno et al. |
| 2006/0003537 A1 | 1/2006 | Sinha |
| 2006/0009165 A1 | 1/2006 | Alles |
| 2006/0160501 A1 | 7/2006 | Mendolia et al. |
| 2006/0183433 A1 | 8/2006 | Mori |
| 2006/0183442 A1 | 8/2006 | Chang |
| 2006/0205368 A1 | 9/2006 | Bustamante |
| 2006/0281423 A1 * | 12/2006 | Caimi et al. .................. 455/129 |
| 2007/0013483 A1 | 1/2007 | Stewart |
| 2007/0035458 A1 | 2/2007 | Ohba |
| 2007/0042725 A1 | 2/2007 | Poilasne |
| 2007/0042734 A1 | 2/2007 | Ryu |
| 2007/0063788 A1 | 3/2007 | Zhu |
| 2007/0080888 A1 | 4/2007 | Mohamadi |
| 2007/0082611 A1 | 4/2007 | Terranova et al. |
| 2007/0085609 A1 | 4/2007 | Itkin |
| 2007/0142014 A1 | 6/2007 | Wilcox |
| 2007/0149146 A1 | 6/2007 | Hwang |
| 2007/0182636 A1 | 8/2007 | Carlson |
| 2007/0184825 A1 | 8/2007 | Lim et al. |
| 2007/0194859 A1 | 8/2007 | Brobston |
| 2007/0197180 A1 | 8/2007 | McKinzie |
| 2007/0200766 A1 | 8/2007 | McKinzie |
| 2007/0293176 A1 | 12/2007 | Yu |
| 2008/0007478 A1 | 1/2008 | Jung |
| 2008/0018541 A1 | 1/2008 | Pang |
| 2008/0055016 A1 | 3/2008 | Morris |
| 2008/0081670 A1 | 4/2008 | Rofougaran |
| 2008/0106350 A1 | 5/2008 | McKinzie |
| 2008/0122553 A1 | 5/2008 | McKinzie |
| 2008/0122723 A1 | 5/2008 | Rofougaran |
| 2008/0129612 A1 | 6/2008 | Wang |
| 2008/0158076 A1 | 7/2008 | Walley |
| 2008/0261544 A1 | 10/2008 | Blin |
| 2008/0274706 A1 | 11/2008 | Blin |
| 2008/0305749 A1 | 12/2008 | Ben-Bassat |
| 2009/0002077 A1 | 1/2009 | Rohani et al. |
| 2009/0027286 A1 | 1/2009 | Ohishi |
| 2009/0082017 A1 | 3/2009 | Chang et al. |
| 2009/0109880 A1 | 4/2009 | Kim |
| 2009/0121963 A1 | 5/2009 | Greene |
| 2009/0149136 A1 | 6/2009 | Rofougaran |
| 2009/0180403 A1 | 7/2009 | Tudosoiu |
| 2009/0215446 A1 | 8/2009 | Hapsari et al. |
| 2009/0231220 A1 | 9/2009 | Zhang et al. |
| 2009/0253385 A1 | 10/2009 | Dent et al. |
| 2009/0264065 A1 | 10/2009 | Song |
| 2009/0278685 A1 | 11/2009 | Potyrailo |
| 2009/0323582 A1 | 12/2009 | Proctor et al. |
| 2010/0041348 A1 | 2/2010 | Wilcox et al. |
| 2010/0053009 A1 | 3/2010 | Rofougaran |
| 2010/0073103 A1 | 3/2010 | Spears et al. |
| 2010/0085260 A1 | 4/2010 | McKinzie |
| 2010/0105425 A1 | 4/2010 | Asokan |
| 2010/0156552 A1 | 6/2010 | McKinzie |
| 2010/0232474 A1 | 9/2010 | Ahmadreza |
| 2010/0302106 A1 | 12/2010 | Knudsen |
| 2010/0304688 A1 | 12/2010 | Knudsen |
| 2011/0012790 A1 | 1/2011 | Badaruzzaman |
| 2011/0102290 A1 | 5/2011 | Milosavljevic |
| 2011/0121079 A1 | 5/2011 | Lawrence et al. |
| 2011/0133994 A1 | 6/2011 | Korva |
| 2011/0183628 A1 | 7/2011 | Baker |
| 2011/0183633 A1 | 7/2011 | Ohba |
| 2011/0256857 A1 | 10/2011 | Chen et al. |
| 2012/0100802 A1 | 4/2012 | Mohebbi |

FOREIGN PATENT DOCUMENTS

| | | |
|---|---|---|
| EP | 0685936 | 6/1995 |
| EP | 0909024 | 12/1999 |
| EP | 1137192 | 9/2001 |
| EP | 1298810 | 4/2006 |
| EP | 2328233 | 6/2011 |
| JP | 03276901 | 8/1998 |
| JP | 10209722 | 8/1998 |
| WO | WO-01/71846 | 9/2001 |
| WO | WO-2008/030165 | 3/2008 |
| WO | WO-2009/064968 | 5/2009 |
| WO | WO-2009/155966 | 12/2009 |
| WO | WO-2011/044592 | 4/2011 |
| WO | WO-2011/133657 | 10/2011 |
| WO | WO-2011028453 | 10/2011 |

OTHER PUBLICATIONS

Patent Cooperation Treaty, "International Search Report and Written Opinion", International Application No. PCT/US2010/056413, Jul. 27, 2011.

Pervez, N.K. "High Tunability barium strontium titanate thin films for RF circuit applications", Applied Physics Letters, 2004 American Institute of Physics.

Stemmer, Susanne, "Low-loss tunable capacitors fabricated directly on gold bottom electrodes", University of California Postprints 2006.

Taylor, T.R., "Impact of thermal strain on the dielectric constant of sputtered barium strontium titanate thin films", Applied Physics Letters, 2002 American Institute of Physics.

Tombak, Ali, "Tunable Barium Strontium Titanate Thin Film Capacitors for RF and Microwave Applications", IEEE Microwave and Wireles Components Letters, vol, 12, Jan. 2002.

Xu, Hongtao, "Tunable Microwave Integrated Circuits using BST Thin Film Capacitors with Device", Integrated Ferroelectrics, Department of Electrical Engineering and Computer Engineering, University of California, 2005.

Du Toit, , "Tunable Microwave Devices with Auto Adjusting Matching Circuit", U.S. Appl. No. 13/302,617, filed Nov. 22, 2011.
Du Toit, , "Tunable Microwave Devices with Auto-Adjusting Matching Circuit", U.S. Appl. No. 13/302,649, filed Nov. 22, 2011.
Greene, , "Method and Apparatus for Tuning a Communication Device", U.S. Appl. No. 13/108,463, filed May 16, 2011.
Greene, , "Method and Apparatus for Tuning a Communication Device", U.S. Appl. No. 13/108,589, filed May 16, 2011.
Hoirup, , "Method and Apparatus for Radio Antenna Frequency Tuning", U.S. Appl. No. 13/030,177, filed Feb. 18, 2011.
Manssen, , "Method and Apparatus for Managing Interference in a Communication Device", U.S. Appl. No. 61/326,206, filed Apr. 20, 2010.
Manssen, , "Method and Apparatus for Tuning Antennas in a Communication Device", U.S. Appl. No. 12/941,972, filed Nov. 8, 2010.
Manssen, , "Method and Apparatus for Tuning Antennas in a Communication Device", U.S. Appl. No. 13/005,122, filed Jan. 12, 2011.
McKinzie, , "Adaptive Impedance Matching Module (AIMM) Control Architectures", U.S. Appl. No. 13/293,544, filed Nov. 10, 2011.
McKinzie, , "Adaptive Impedance Matching Module (AIMM) Control Architectures", U.S. Appl. No. 13/293,550, filed Nov. 10, 2011.
McKinzie, , "Method and Apparatud for Adaptive Impedance Matching", U.S. Appl. No. 13/217,748, filed Aug. 25, 2011.
Mendolia, , "Method and Apparatus for Tuning a Communication Device", U.S. Appl. No. 13/035,417, filed Feb. 25, 2011.
Paratek Microwave, Inc., , "Method and Apppartus for Tuning Antennas in a Communication Device", International Application No. PCT/US11/59620; Filed Nov. 7, 2011.
Spears, , "Methods for Tuning and Adaptive Impedance Matching Network with a Look-Up Table", U.S. Appl. No. 13/297,951, filed Nov. 16, 2011.
Bezooijen, A. et al., "A GSM/EDGE/WCDMA Adaptive Series-LC Matching Network Using RF-MEMS Switches", IEEE Journal of Solid-State Circuits, vol. 43, No. 10, Oct. 2008, 2259-2268.
Huang, Libo et al., "Theoretical and experimental investigation of adaptive antenna impedance matching for multiband mobile phone applications", IEEE, Sep. 7, 2005, 13-17.
Patent Cooperation Treaty, , "International Search Report and Written Opinion", Nov. 16, 2011, International Application No.PCT/US/2011/038543.
Payandehjoo, Kasra , "Novel Techniques for Coupling Reduction in Multi-Antenna Hand-held Devices", IEEE Student Member, 1-8.
Petit, Laurent , "MEMS-Switched Parasitic-Antenna Array for.Radiation Pattern Diversity", IEEE Transactions on Antennas and Propagation, vol. 54, No. 9, Sep. 2009, 2624-2631.
Zuo, S. , "Eigenmode Decoupling for Mimo Loop-Antenna Based on 180 Coupler", Progress in Electromagnetics Research Letters, vol. 26, 2011, 11-20.
Ida, I. et al., "An Adaptive Impedance Matching System and Its Application to Mobile Antennas", TENCON 2004, IEEE Region 10 Conference, See Abstract ad p. 544, Nov. 21-24, 2004, 543-547.
Patent Cooperation Treaty, "International Search Report and Written Opinion", International Application No. PCT/US2010/046241, Mar. 2, 2011.
Patent Cooperation Treaty, , "International Search Report and Written Opinion", PCT Application No. PCT/US08/005085, Jul. 2, 2008.
Qiao, et al., "Antenna Impedance Mismatch Measurement and Correction for Adaptive COMA Transceivers", IEEE, 2005.
Qiao, et al., "Measurement of Antenna Load Impedance for power Amplifiers", The Department of Electrical and Computer Engineering, University of California, San Diego, Sep. 13, 2004.

* cited by examiner

ADAPTIVE MATCHING NETWORK

PRIOR APPLICATION

This application is a continuation of U.S. patent application Ser. No. 11/653,639 filed Jan. 16, 2007 by McKinzie et al., entitled "Adaptive Impedance Matching Module (AIMM) Control Architectures," which claims the benefit of Provisional Patent Application Ser. No. 60/758,862, filed Jan. 14, 2006 entitled "TECHNIQUES FOR ADAPTIVE IMPEDANCE MATCHING", by McKinzie et al. All sections of the aforementioned applications are incorporated herein by reference.

BACKGROUND

Mobile communications have become common place throughout society. Not only is voice communications prevalent, but also the need for mobile data communications such as email, and Internet browsing has increased. The efficiency of RF systems in mobile communications, such as antenna efficiency of a mobile device as it undergoes changes in its environment, can affect among other things the quality of communications experienced by mobile subscribers. Efficient RF power transfer, or good impedance matching, can affect the performance of RF subsystems, such as at the input port of an antenna, between filters, at the output stages of power amplifiers, and even inter-stage matching between amplifier stages.

Impedance matching networks can be used by various devices and systems, for example, a transmitter, a receiver, a transceiver, a wireless communication station, or a wireless communication device. Examples of RF systems that can utilize impedance matching networks include without limitation, a wireless Access Point (AP), a modem, a wireless modem, a computer (e.g., desktop computer, a mobile computer, a laptop computer, a notebook computer, a tablet computer, a server computer, a handheld computer, a handheld device, a Personal Digital Assistant (PDA) device, a network, a wireless network, a Local Area Network (LAN), a Wireless LAN (WLAN), a Metropolitan Area Network (MAN), a Wireless MAN (WMAN), a Wide Area Network (WAN), a Wireless WAN (WWAN), devices and/or networks operating in accordance with existing IEEE 802.11x, 802.16x standards and/or future versions and/or derivatives and/or Long Term Evolution (LTE) of the above standards, a Personal Area Network (PAN), a Wireless PAN (WPAN), units and/or devices which are part of the above WLAN and/or PAN and/or WPAN networks, one way and/or two-way radio communication systems, cellular radio-telephone communication systems, a cellular telephone, a wireless telephone, a Personal Communication Systems (PCS) device, a PDA device which incorporates a wireless communication device, a Multiple Input Multiple Output (MIMO) transceiver or device, a Single Input Multiple Output (SIMO) transceiver or device, a Multiple Input Single Output (MISO) transceiver or device, a Multi Receiver Chain (MRC) transceiver or device, a transceiver or device having "smart antenna" technology or multiple antenna technology, or the like.

The above RF systems can utilize any number of RF signaling techniques such as, for example, Frequency-Division Multiplexing (FDM), Orthogonal FDM (OFDM), Time-Division Multiplexing (TDM), Time-Division Multiple Access (TDMA), Extended TDMA (E-TDMA), General Packet Radio Service (GPRS), Extended GPRS, Code-Division Multiple Access (CDMA), Wideband CDMA (WCDMA), CDMA 2000, Multi-Carrier Modulation (MDM), Discrete Multi-Tone (DMT), Bluetooth®, ZigBee™, or the like.

The above RF systems can utilize impedance matching networks whose load impedance can vary with time, temperature, power levels, component values, and many other communication parameters.

DETAILED DESCRIPTION

Figure 1:
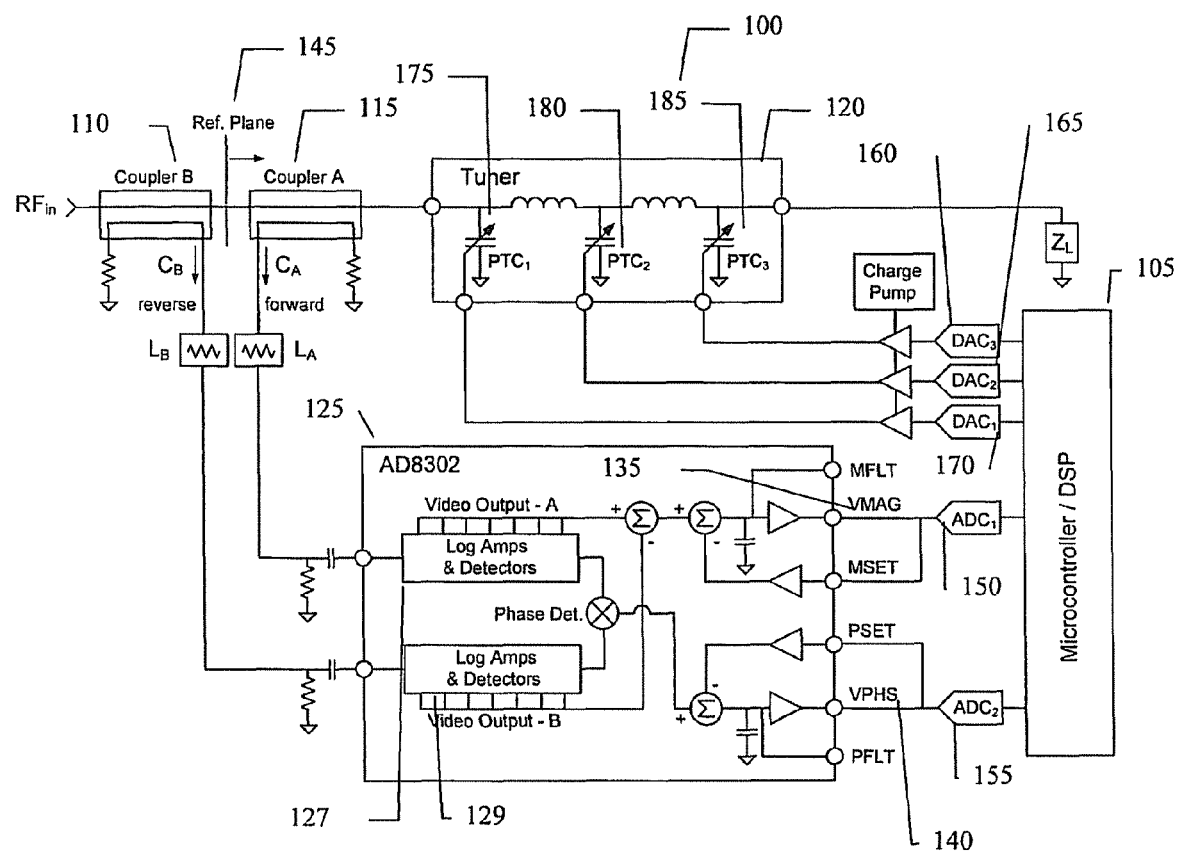
FIG. 1 depicts an illustrative embodiment of simultaneous measurements of magnitude and phase for both forward and reflected waves.

In the following detailed description, numerous specific details are set forth in order to provide an understanding of the present disclosure. However, it will be understood by those skilled in the art that the present disclosure can be practiced without these specific details. In other instances, well-known methods, procedures, components and circuits have not been described in detail so as not to obscure the present disclosure.

Some portions of the detailed description that follows are presented in terms of algorithms and symbolic representations of operations on data bits or binary digital signals within a computer memory. These algorithmic descriptions and representations can be the techniques used by those skilled in the data processing arts to convey the substance of their work to others skilled in the art.

An algorithm is here, and generally, considered to be a self-consistent sequence of acts or operations leading to a desired result. These include physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers or the like. It should be understood, however, that all of these and similar terms are to be associated with the appropriate physical quantities and are merely convenient labels applied to these quantities.

Unless specifically stated otherwise, as apparent from the following discussions, it is appreciated that throughout the specification discussions utilizing terms such as "processing," "computing," "calculating," "determining," or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

Embodiments of the present disclosure can include apparatuses for performing the operations herein. An apparatus can be specially constructed for the desired purposes, or it can comprise a general purpose computing device selectively activated or reconfigured by a program stored in the device. Such a program can be stored on a storage medium, such as, but not limited to, any type of disk including floppy disks, optical disks, compact disc read only memories (CD-ROMs), magnetic-optical disks, read-only memories (ROMs), random access memories (RAMs), electrically programmable read-only memories (EPROMs), electrically erasable and programmable read only memories (EEPROMs), magnetic or optical cards, or any other type of media suitable for storing electronic instructions, and capable of being coupled to a system bus for a computing device (e.g., non-volatile programmable read-writeable memories such as Flash memories).

The processes and displays presented herein are not inherently related to any particular computing device or other apparatus. Various general purpose systems can be used with programs in accordance with the teachings herein, or it can prove convenient to construct a more specialized apparatus to perform the desired method. The desired structure for a variety of these systems will appear from the description below. In addition, embodiments of the present disclosure are not described with reference to any particular programming language. It will be appreciated that a variety of programming languages can be used to implement the teachings of the present disclosure as described herein. In addition, it should be understood that operations, capabilities, and features described herein can be implemented with any combination of hardware (discrete or integrated circuits) and software.

Use of the terms "coupled" and "connected", along with their derivatives, can be used. It should be understood that these terms are not intended as synonyms for each other. Rather, in particular embodiments, "connected" can be used to indicate that two or more elements are in direct physical or electrical contact with each other. "Coupled" can be used to indicate that two or more elements are in either direct or indirect (with other intervening elements between them) physical or electrical contact with each other, and/or that the two or more elements co-operate or interact with each other (e.g., as in a cause an effect relationship).

One embodiment of the present disclosure can entail an apparatus having a matching network adapted to reduce a magnitude of a signal reflection at a port of the matching network. The matching network can have one or more controllable variable reactive elements. A controller can be adapted to determine reflection coefficient information from incident and reflected waves sampled at the port of the matching network, and follow at least one cycle of a coarse tune process for generating one or more control signals to tune one or more reactances of the one or more controllable variable reactive elements.

One embodiment of the present disclosure can entail a computer-readable storage medium having computer instructions to determine an input reflection coefficient from incident and reflected waves detected at a port of a matching network, and coarse tune one or more controllable variable reactive elements of the matching network with one or more control signals determined according to the input reflection coefficient.

One embodiment of the present disclosure can entail a method that involves determining a reflection coefficient from a signal sampled at a port, determining at least one control signal from the reflection coefficient, and tuning a matching network with one or more control signals, wherein the matching network comprises one or more controllable variable reactive elements each with an independent control voltage.

Embodiments of the present disclosure can provide several feedback control system concepts for potential use in an adaptive impedance matching module (AIMM). These concepts can vary in RF system complexity, and hence cost. In an embodiment of the present disclosure, a basic technical objective can be to minimize the magnitude of the input reflection coefficient seen at an $RF_{in}$ port under the boundary condition of a variable load impedance ZL.

Looking at FIG. 1, generally as 100, is a first embodiment using simultaneous measurement of magnitude and phase for both forward and reflected waves using identical backward-wave couplers A 115 and B 110 which sample incident and reflected waves respectively at the input side of a tuner 120. Coupled and attenuated RF signals can be fed into a single integrated circuit (IC) which can contain dual channel log amplifiers 127 and 129 followed by gain and phase detectors (such as built into the AD8302 as shown as 125). The dual outputs of the AD8302 125 can generate a first voltage, $V_{MAG}$ 135 which is proportional to the ratio in dB of the input powers (forward and reversed), and a second voltage, VPHS 140, which is proportional to the phase difference between the two input signals. These two voltages can be digitally sampled in a closed loop control system.

The reference plane 145 for the measurement can be approximated as midway between the two directional couplers 110 and 115, which should be located as close together as possible. The finite directivity D of the couplers 110 and 115 sets the minimum detectable reflection coefficient. The two RF paths between the couplers 110 and 115 and the AD8302 125 should be as well matched as possible since any differences create measurement errors. Also, the frequency response of the couplers 110 and 115 should be as close as possible or the differences can be compensated in software.

The phase detector inside the AD8302 125 can uniquely distinguish instantaneous phase over a range of only 180°. Thus, the phase can be identified to within a plus or minus sign. So either $\Gamma$ or its complex conjugate is known. The tuning algorithm will have to account for this degree of uncertainty.

In an embodiment of the present disclosure, a microcontroller or DSP chip 105 can sample the complex reflection coefficient information from ADC1 150 and ADC2 155. Since the reflection coefficient phase angle is known, a look-up table can be used to immediately perform a coarse tune function that feeds approximate bias voltages to the three DACs 160, 165 and 170 that in turn control high voltage buffers driving the PTCs 175, 180, 185. PTCs are a type of variable reactance network denoted as Parascan™ Tunable Capacitors, and they implement a variable capacitor function. If the magnitude of the reflection coefficient is not below a desired level, then fine tuning can be accomplished using small and iterative adjustments in bias voltage. Fine tuning can be necessary to compensate for variations in manufacturing tolerances of tuner component values, or to compensate for temperature variations of the PTCs under high power.

In an exemplary embodiment, three PTCs with independent control voltages are used in the tuner 120. However, it is understood that in general, any finite number of variable reactance networks with independent bias voltages or bias currents could be included. Also, the exemplary embodiments herein, a ladder network with series inductors and shunt caps is described. However, other tuner circuit topologies can also be used, and are thus intended to be within the scope of the present disclosure.

Figure 2:
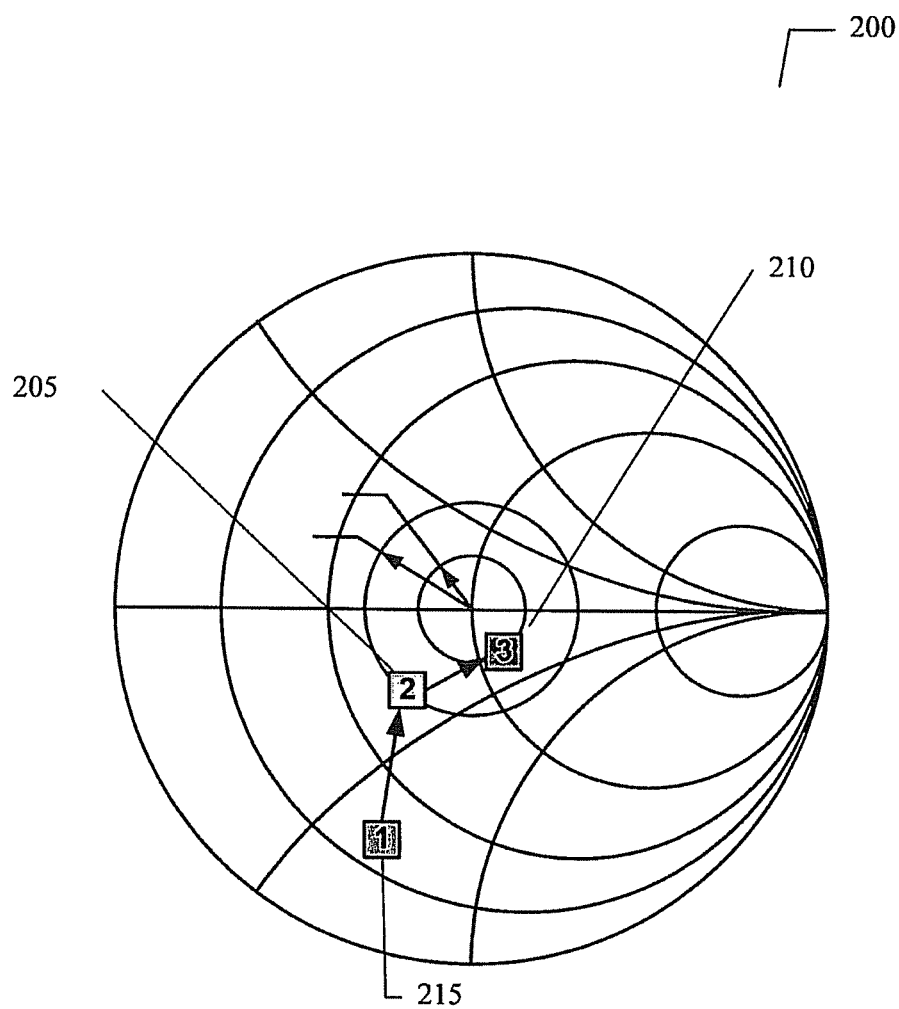
FIG. 2 depicts an illustrative embodiment of a Smith Chart illustrating course to fine tuning.

As an example to help understand the tuning process, consider the Smith Chart shown in FIG. 2 at 200. Assume the initial input reflection coefficient at a desired frequency is shown at 215 in this example. Coarse tuning moves the reflection coefficient Γ from point [1] 215 to point [2] 205 where the magnitude is now $|\Gamma_2|$. Application of a fine tuning algorithm moves the reflection coefficient from point [2] 205 to point [3] 210 where the magnitude is $|\Gamma_3|$. Repeated application of the fine tuning algorithm decreases $|\Gamma|$ further until a specified tolerance is achieved.

The fine tuning algorithm can be a scalar multi-variable minimization algorithm where the independent variables are the set of tuning voltages and the scalar cost function can be the magnitude of the reflection coefficient in dB. Many choices exist for this minimization algorithm including, but not limited to:
1. Downhill simplex method in multidimensions (section 10.4 of Numerical Recipes);
2. Conjugate gradient method in multidimensions (section 10.6 of Numerical Recipes);
3. Quasi-Newton method (section 10.7 of Numerical Recipes).

A digital processor can drive digital-to-analog converters (DACs) whose output voltage is scaled with high voltage buffers to yield PTC bias voltages of zero to about 30 volts. A charge pump 190 can be used to multiply a typically available supply voltage of 3.3 volts to more than 30 volts to power the voltage buffers, although the present disclosure is not limited in this respect.

The charge pump 335 can be generalized to include any DC-to-DC converter capable of converting the available supply voltage to a desired higher or lower voltage, and this desired voltage can be positive or negative polarity, or dual positive and negative polarity. Furthermore, the 30 volt maximum PTC voltage used in the above example can be higher or lower depending on the design of the variable capacitors.

Figure 3:
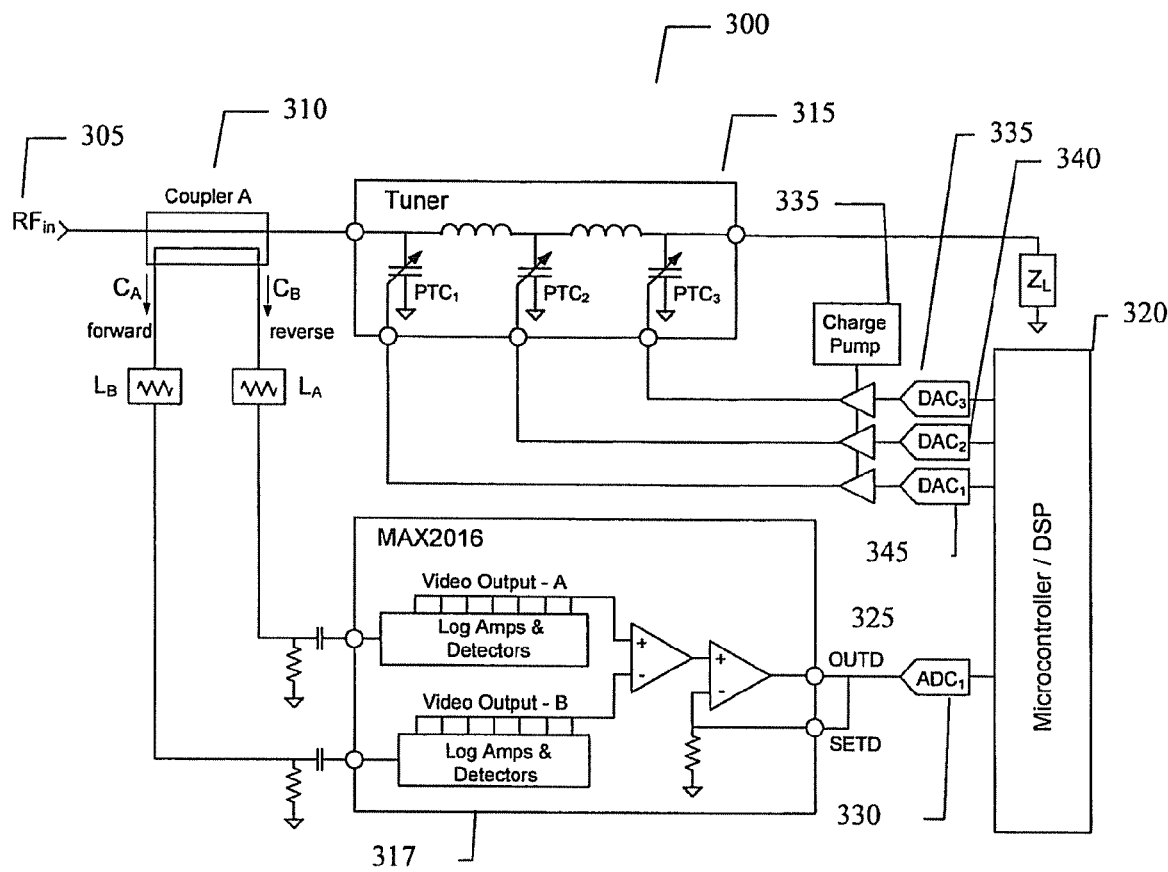
FIG. 3 depicts an illustrative embodiment of simultaneous measurement of magnitude and phase for both forward and reflected waves.

The voltage buffers in FIGS. 1 and 3 located between the DACs and PTCs can be replaced with transconductance amplifiers if the PTCs are replaced with variable reactance networks requiring a bias current rather than a bias voltage.

Depending on the processor implementation, the ADCs 150 and 155 and DACs 160, 165 and 170 can be integrated into the processor IC 105. The merits of this first embodiment of the present disclosure include that the digital control system can react very quickly to changes in load impedance since coarse tuning can be achieved with only one RF measurement. This is possible since both magnitude and phase of the reflection coefficient are simultaneously available.

A second embodiment of the present disclosure is illustrated in FIG. 3 at 300 and provides the simultaneous measurement of magnitude for both forward and reflected waves. In an embodiment of the present disclosure, a single backward-wave coupler 310 can sample incident and reflected power at the input side of the tuner 315. Coupled and attenuated RF signals 305 can be fed into a detector, such as a MAX2016 Dual Logarithmic Detector 317. The video output voltages (in dB) can be subtracted internally to create a difference signal at the output OUTD 325 which is proportional to the return loss in dB. Measured return loss is given by the simple formula $$RL(\text{dB}) = \frac{(V_{OUTD} - V_{CENTER})}{\text{Slope}}$$

where $V_{CENTER}$ is the output voltage under the condition of equal voltages at each input channel. The Slope is about 25 mV/dB. This return loss can then be digitally sampled in a closed loop control system. As with the previous embodiment, the finite directivity D of the coupler sets the minimum detectable reflection coefficient.

A microcontroller or DSP chip 320 samples the return loss information using ADC1 330. Since the reflection coefficient phase angle is unknown, an iterative tuning algorithm can be required to minimize return loss. The tuning algorithm can be a scalar multi-variable minimization routine where the independent variables are the set of tuning voltages and the scalar cost function is the magnitude of the reflection coefficient in dB. Many choices exist for this minimization algorithm including:
1. Downhill simplex method in multidimensions (section 10.4 of Numerical Recipes)
2. Conjugate gradient method in multidimensions (section 10.6 of Numerical Recipes)
3. Quasi-Newton method (section 10.7 of Numerical Recipes)

The digital processor drives digital-to-analog converters (DACs) 335, 340 and 345 whose output voltage is scaled with high voltage buffers to yield PTC bias voltages of zero to about 30 volts. A charge pump 350 can be used to multiply a typically available supply voltage of 3.3 volts to more than 30 volts to power the voltage buffers.

Depending on the processor implementation, the ADC 330 and DACs 335, 340 and 345 can be integrated into the processor IC 317. The merit of this second embodiment is that return loss can be immediately measured in one digital sample.

Figure 4:
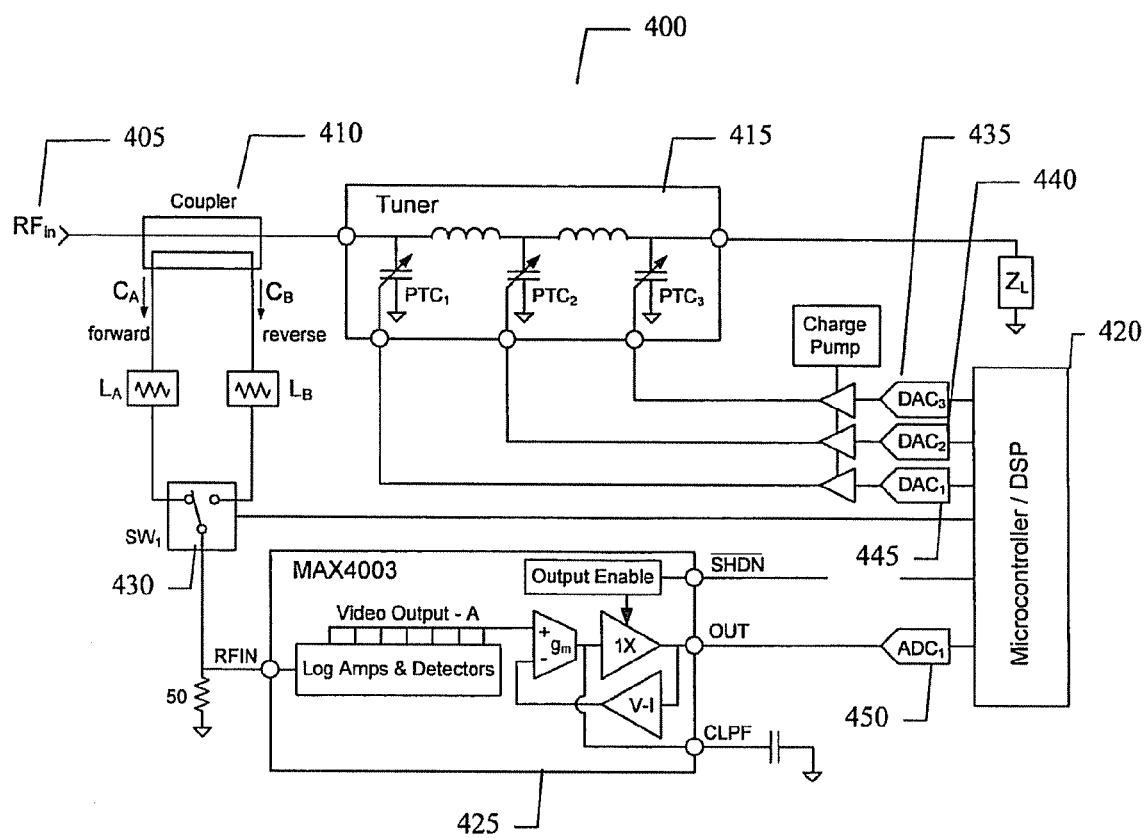
FIG. 4 depicts an illustrative embodiment of sequential measurement of magnitude for both forward and reflected waves.

Turning now to FIG. 4, is a third embodiment of the present disclosure and provides sequential measurement of magnitude for both forward and reflected waves. In this third embodiment of the present disclosure, a closed loop control system is built around a low cost MAX4003 log amplifier 425, although the present disclosure is not limited to any specific amplifier. A single backward-wave coupler 410 samples incident and reflected power at the input side of the tuner 415. The incident and reflected power levels are switched at $SW_1$ 430 such that they can be measured in sequence, as controlled by the processor. The MAX4003 426 output voltage, which is proportional to coupled power in dB, can be digitized and the return loss can then be calculated by the processor using sequential measurements. As with previous embodiments, the finite directivity D of the coupler sets the minimum detectable return loss.

The MAX4003 425 log amp was selected because it has a shutdown mode where it draws only 13 uA of current. Furthermore, when powered, it consumes only 6 mA from a 3.0 volt supply (18 mW). Again, the present disclosure is not limited to using any particular log amp.

Since the microcontroller or DSP chip 420 computes only the return loss (no phase information is available), then an iterative tuning algorithm is required to minimize return loss. The tuning algorithm is a scalar multi-variable minimization routine where the independent variables are the set of tuning voltages and the scalar cost function is the magnitude of the reflection coefficient in dB. Many choices exist for this minimization algorithm including:

1. Downhill simplex method in multidimensions;
2. Conjugate gradient method in multidimensions; and
3 Quasi-Newton method.

As with the previous embodiments, the digital processor drives digital-to-analog converters (DACs) 435, 440 and 445 whose output voltage is scaled with high voltage buffers to yield PTC bias voltages of zero to about 30 volts. Depending on the processor implementation, the ADC 450 and DACs 435, 440 and 445 can be integrated into the processor IC.

The merits of the present third embodiment include, but are not limited to:

A relatively low cost log amp is employed. At the time of the present disclosure, the MAX4003 sells for ~$1.09 in qty of 100.

The MAX4003 log amp consumes only 18 mW of power during normal operation at 3.0 volts.

The log amp can be powered down when power measurements are not required.

Figure 5:
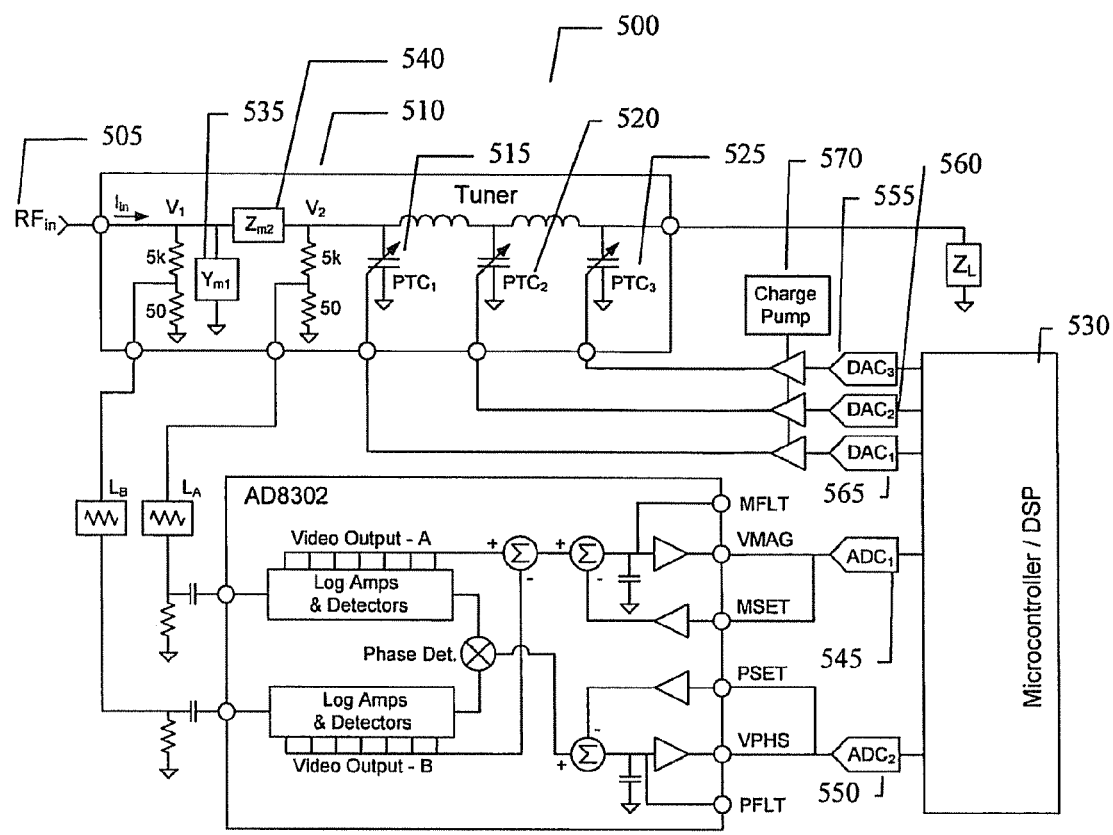
FIG. 5 depicts an illustrative embodiment of direct measurement of a ratio of the first two nodal voltages.

Turning now to FIG. 5, is a fourth embodiment of the present disclosure and provides direct measurement of the ratio of the first two nodal voltages. This embodiment is designed to offer an "indirect" measurement of input impedance or input reflection coefficient for the tuner 510. In contrast, a direct measurement would involve directional couplers as in previous embodiments. By eliminating the directional couplers one saves Bill of Material (BOM) cost and board real estate and eliminates a bandwidth restriction caused by miniature narrowband couplers.

The input impedance sensing circuit consists of two additional known reactive components on the input side of the tuner, namely $Y_{m1}$ 535 and $Z_{m2}=1/Y_{m2}$ 540. RF voltages V1 and V2 are measured using high impedance (relative to Zo=50 W) resistive voltage dividers. The input impedance can be expressed as $$Z_{in} = \frac{V_1}{I_{in}} = \frac{V_1}{V_1 Y_{m1} + \left(\frac{V_1 - V_2}{Z_{m2}}\right)} = \frac{1}{Y_{m1} + \left(\frac{1 - V_2/V_1}{Z_{m2}}\right)} = \frac{1}{Y_{in}}.$$

Since the input reflection coefficient $\Gamma$ can be expressed in terms of input admittance, then $$\Gamma = \frac{Y_o - Y_{in}}{Y_o + Y_{in}} = \frac{Y_o - Y_{m1} - \left(\frac{1 - V_2/V_1}{Z_{m2}}\right)}{Y_o + Y_{m1} + \left(\frac{1 - V_2/V_1}{Z_{m2}}\right)} = \frac{Y_o - Y_{m1} - Y_{m2}(1 - V_2/V_1)}{Y_o + Y_{m1} + Y_{m2}(1 - V_2/V_1)}.$$

Hence the complex value of $\Gamma$ is known with one digital sample of the complex ratio of nodal voltages. It should be noted that components $Y_{m1}$ 535 and $Z_{m2}$ 540 are not restricted, but they must be known. Their values are chosen by the system designer, and $Y_{m1}$ 535 can be set to zero (omitted) if desired. Only a series component is required for this approach to work. The accuracy of the indirectly measured $\Gamma$ is defined largely by the component tolerances of $Y_{m1}$ 535 and $Z_{m2}$ 540.

One could design the tuner 510 such that $Y_{m1}$ 535 is the first shunt voltage tunable capacitor (PTC) and $Z_{m2}$ 540 is the first series inductor, or a short series transmission line. However, this would require that the PTC capacitance be known very accurately for all bias voltages and temperatures. While it is conceivable to obtain such detailed information, it cannot be practical in high volume production depending on the tolerance required A microcontroller or DSP chip 530 samples the complex node voltage ratio from ADC1 545 and ADC2 550 and calculates the complex input reflection coefficient directly from the equation above. A look-up table can be used to immediately perform a coarse tune function that feeds approximate bias voltages to the three DACs 555, 560 and 565 that in turn control high voltage buffers for the PTCs 515, 520, 525. If the magnitude of the reflection coefficient is not below a desired level, then fine tuning can be accomplished using small and iterative adjustments in bias voltage. Fine tuning can be necessary to compensate for variations in manufacturing tolerances of tuner component values, or to compensate for temperature variations of the PTCs under high power.

The fine tuning algorithm can be a scalar multi-variable minimization algorithm where the independent variables are the set of tuning voltages and the scalar cost function can be the magnitude of the reflection coefficient in dB. Many choices exist for this minimization algorithm including 1. Downhill simplex method in multidimensions;
2. Conjugate gradient method in multidimensions; and
3. Quasi-Newton method.

The digital processor 530 drives digital-to-analog converters (DACs) 555, 560 and 565 whose output voltage is scaled with high voltage buffers to yield PTC bias voltages of zero to about 30 volts. A charge pump 570 can be used to multiply a typically available supply voltage of 3.3 volts to more than 30 volts to power the voltage buffers. Depending on the processor implementation, the ADCs 545 and 550 and DACs 555, 560 and 565 can be integrated into the processor IC.

The merits of the present embodiment shown in FIG. 5 include:

Board real estate can be reduced significantly because directional couplers are not needed, and the resistive dividers occupy a very small footprint.

The cost of directional couplers is eliminated.

The bandwidth of the reflection coefficient sensing circuit is significantly increased relative to using miniature ceramic hybrid couplers.

The digital control system can react very quickly to changes in load impedance since course tuning can be achieved with only one RF measurement. This is possible since both magnitude and phase of the first two nodal voltages are simultaneously available.

Figure 6:
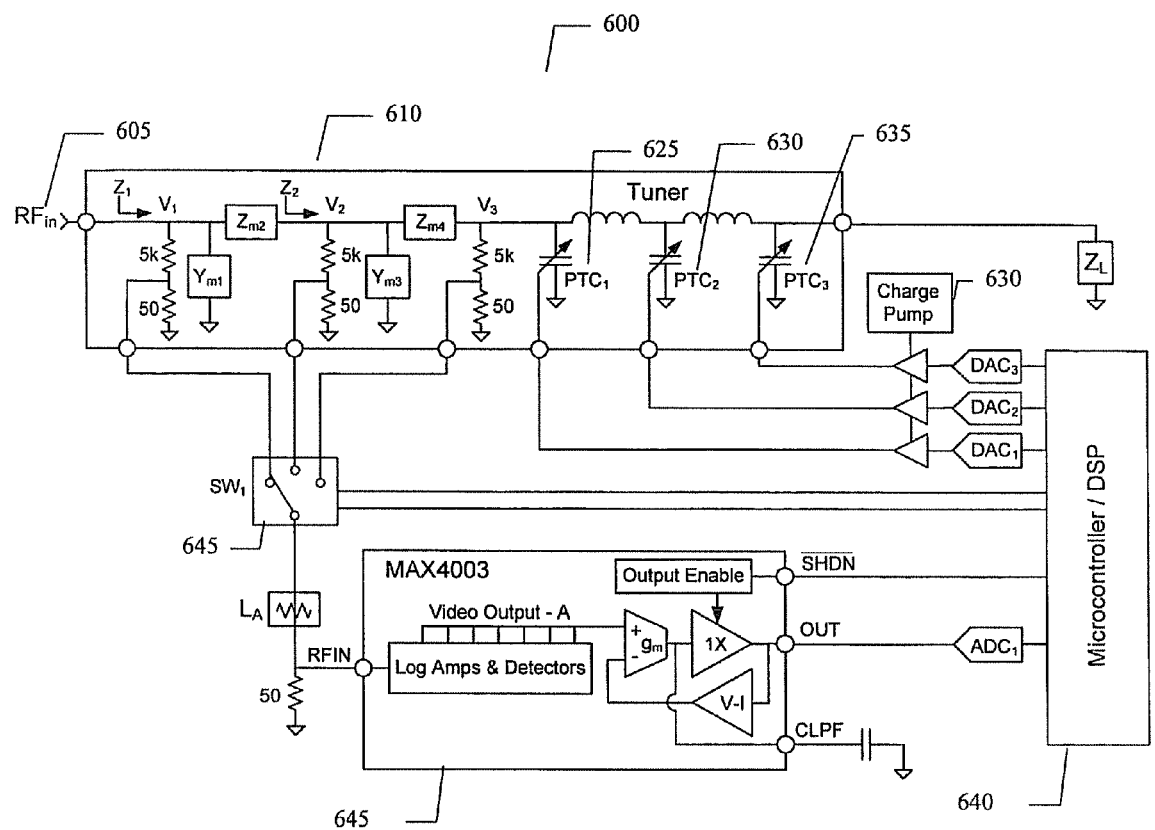
FIG. 6 depicts an illustrative embodiment of direct measurement of three nodal voltages.

Turning now to FIG. 6, is a fifth embodiment of the present disclosure and provides direct measurement of the ratio of the first two nodal voltages. In this embodiment is a modification of embodiment 4 where three node voltages are measured instead of two, and only their magnitudes are measured using a single channel log amp or temperature compensated diode detector. Ratios of node voltages are calculated by the microcontroller/DSP 640. Any ambiguity of V1 and V2 used to calculate Z1 based on magnitude measurements can be resolved by calculating Z2 from a measurement of a second pair of voltages, V2 and V3. Then Z2 is mapped into Z1 given the known values of shunt and series measurement impedances. In this manner, three measurements of node voltage magnitude permit a unique determination of the input impedance Z1 for the tuner.

The first through third embodiments described above can use directional couplers to measure forward and reflected power. So for these embodiments, the minimum dynamic range needed by the detector is the magnitude of the best case return loss that is desired to be resolved, plus the dynamic range of the input RF signal. So if it is desired to resolve a return loss down to −20 dB and operate the AIMM over a 30 dB dynamic range of input powers, then a 50 dB (20 dB+30 dB) log amplifier can be needed. In contrast, the fourth and fifth embodiments measure the total RF voltage at the nodes. These voltages are expected to be fairly similar in magnitude, especially for a well matched tuner. So the detector's required dynamic range is expected to be less for embodiments 4 and 5.

Current consumption will also be less for the MAX2205-2208 family of detectors relative to a log amp. They typically consume only 3.5 mA or less at 3 volts, and 0.5 uA at shutdown. The ability to create a successful AIMM depends on two critical technical achievements. The first requirement is to create a highly-linear, series network of low loss, tunable capacitors. But the second requirement is for a monolithic, low cost, logarithmic amplifier with a broad dynamic range. Dynamic range is very important for many cell phone applications where transmit power control over multiple decades is required, although the present disclosure is not limited in this respect.

The advent of a log amp with an integrated phase detector provides a dramatic advantage in closed loop settling time compared to conventional log amps with only envelope detection. The reason for the advantage is that phase and magnitude information are used together to achieve coarse tuning with only one sample of reflection coefficient or node voltage. The only commercially available log amp with a phase detector is Analog Devices part number AD8302. However, the cost of the AD8302 is expected to be an order of magnitude higher than a conventional single channel log amp. One of the major drawbacks of the AD8302 is its relatively high current consumption at 20 mA and a shutdown feature is needed on a future version of this part. As with FIG. 5, switch SW1 is shown at 645 and tuner 610 can include voltage tunable capacitors, such as voltage tunable dielectric varactors, which can be referred to as Parascan® Tunable Capacitors (PTCs). Charge pump 630 can also be included such as with the charge pump of FIG. 5.

In some embodiments of the present disclosure described above, the impedances added to the tuner for measurements of F in the fourth embodiment can be any reactance. However, an obvious option is to use a shunt capacitor followed by a series inductor. This will preserve the ladder circuit topology that was employed in each of the previous embodiments.

Figure 7:
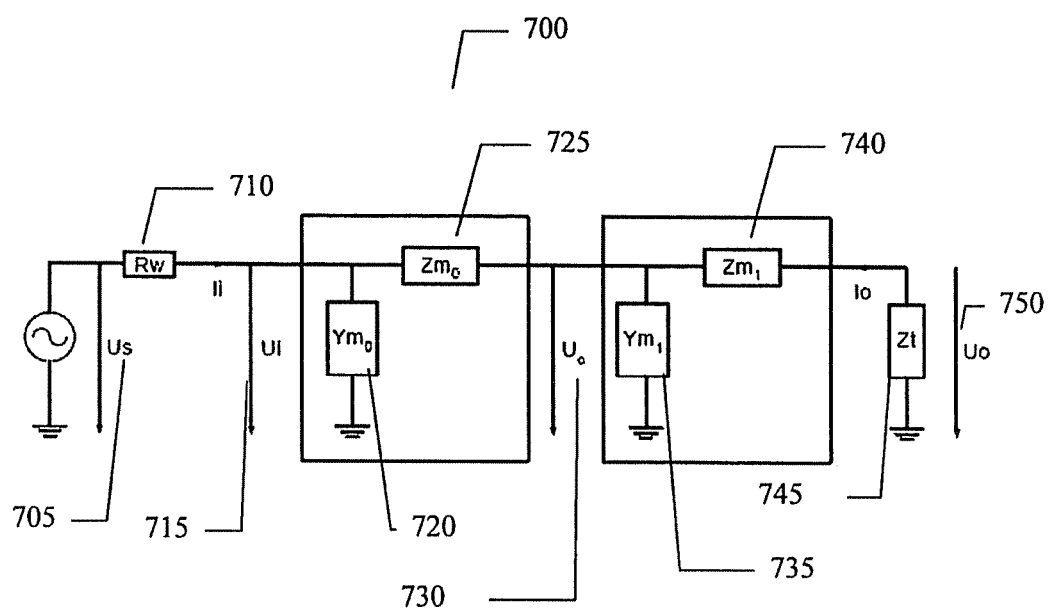
FIG. 7 depicts an illustrative embodiment of an apparatus that can use a method to compute a terminating impedance of a cascade of 2-port devices.

Looking now at FIG. 7 is an embodiment of the present disclosure that illustrates a method to compute the terminating impedance of a cascade of 2-port devices 700 which are characterized through transmission (or ABCD) parameters and to which a signal from a source with a known impedance is applied by measuring the magnitude of the voltages at the input and output of the cascade and between the devices. Depicted in FIG. 7 is:

--- source voltage $U_s$ 705; reference impedance $R_w$ 710; network elements $Z_m$ 725 and 740 and $Y_m$ 720 and 735; terminating impedance $Z_t$ 745; input voltage $U_i$ 715; voltage $U_c$ 730; and output voltage $U_o$ 750, Indices $\quad i := 0 \quad c := 1 \quad o := 2$
Source Voltage $\quad Us := 2 \text{ V}$
Reference Impedance $\quad Rw := 50 \ \Omega$
Network Elements $\quad Zm := (1 + 4.5j \quad 1 - 5j)^{Tj}$
$\quad Ym := (0.2 - 0.4j \quad 0.075 - 0.264j)^{Tiho}$
Terminating Impedance $\quad Zt := 20 - 75j \ \Omega$ Given this information we can compute the input voltage $U_i$ as $$U_i := \frac{1}{1 + \left(Ym_0 + \dfrac{1}{Zm_0 + \dfrac{1}{Ym_1 + \dfrac{1}{Zm_1 + Zt}}}\right) \cdot Rw} \cdot Us \quad |U_i| = 0.069824 \quad |U_i| = 0.069824$$

the voltage $U_c$ as $$U_c := \frac{\dfrac{1}{Ym_1 + \dfrac{1}{Zm_1 + Zt}}}{Zm_0 + \dfrac{1}{Ym_1 + \dfrac{1}{Zm_1 + Zt}}} \cdot U_i \quad |U_c| = 0.031494$$

and the output voltage $U_o$ as $$U_o := \frac{Zt}{Zm_1 + Zt} \cdot U_c \quad |U_o| = 0.028553$$

Transmission parameters $$A1 := \begin{pmatrix} \dfrac{1}{Zm_0} & 1 \\ \dfrac{Ym_0}{Zm_0} & Ym_0 + \dfrac{1}{Zm_0} \end{pmatrix} \cdot Zm_0 \quad A1 = \begin{pmatrix} 1 & 1 + 4.5j \\ 0.2 - 0.4j & 3 + 0.5j \end{pmatrix}$$

$$A2 := \begin{pmatrix} \dfrac{1}{Zm_1} & 1 \\ \dfrac{Ym_1}{Zm_1} & Ym_1 + \dfrac{1}{Zm_1} \end{pmatrix} \cdot Zm_1 \quad A2 = \begin{pmatrix} 1 & 1 - 8j \\ 0.075 - 0.264j & -1.037 - 0.864j \end{pmatrix}$$

-continued $$Ac := A1 \cdot A2 \qquad Ac = \begin{pmatrix} 2.263 + 0.073j & 3.851 - 13.531j \\ 0.557 - 1.155j & -5.679 - 5.111j \end{pmatrix}$$

$$U_i := \frac{Z_i}{Rw + Z_i} \cdot Us = \frac{(Ac_{0,0} \cdot Zt + Ac_{0,1}) \cdot Us}{(Ac_{1,0} \cdot Zt + Ac_{1,1}) \cdot Rw + Ac_{0,0} \cdot Zt + Ac_{0,1}} \tag{1}$$

$$U_o = \frac{Zt \cdot U_i}{Ac_{0,0} \cdot Zt + Ac_{0,1}} = \frac{Zt \cdot Us}{(Ac_{1,0} \cdot Zt + Ac_{1,1}) \cdot Rw + Ac_{0,0} \cdot Zt + Ac_{0,1}} \tag{2}$$

$$U_c = \frac{(A2_{0,0} \cdot Zt + A2_{0,1}) \cdot Us}{(Ac_{1,0} \cdot Zt + Ac_{1,1}) \cdot Rw + Ac_{0,0} \cdot Zt + Ac_{0,1}} \tag{3}$$

We divide the transmission parameters and the termination into real and imaginary components
Ar1 := Re(A1)   Ai1 := Im(A1)
Ar2 := Re(A2)   Ai2 := Im(A2)
Arc := Re(Ac)   Aic := Im(Ac)
Xt := Re(Zt)    Yt := Im(Zt)
and express the magnitudes of the measured voltages as $$(|U_i|)^2 = \frac{[(Arc_{0,0} \cdot Xt - Aic_{0,0} \cdot Yt + Arc_{0,1})^2 + (Aic_{0,0} \cdot Xt + Arc_{0,0} \cdot Yt + Aic_{0,1})^2] \cdot Us^2}{[(Arc_{1,0} \cdot Rw + Arc_{0,0}) \cdot Xt - (Aic_{1,0} \cdot Rw + Aic_{0,0}) \cdot Yt + Arc_{1,1} \cdot Rw + Arc_{0,1}]^2 \ldots + [(Aic_{1,0} \cdot Rw + Aic_{0,0}) \cdot Xt + (Arc_{1,0} \cdot Rw + Arc_{0,0}) \cdot Yt + Aic_{1,1} \cdot Rw + Aic_{0,1}]^2} \tag{4}$$

$$(|U_c|)^2 = \frac{[(Ar2_{0,0} \cdot Xt - Ai2_{0,0} \cdot Yt + Ar2_{0,1})^2 + (Ai2_{0,0} \cdot Xt + Ar2_{0,0} \cdot Yt + Ai2_{0,1})^2] \cdot Us^2}{[(Arc_{1,0} \cdot Rw + Arc_{0,0}) \cdot Xt - (Aic_{1,0} \cdot Rw + Aic_{0,0}) \cdot Yt + Arc_{1,1} \cdot Rw + Arc_{0,1}]^2 \ldots + [(Aic_{1,0} \cdot Rw + Aic_{0,0}) \cdot Xt + (Arc_{1,0} \cdot Rw + Arc_{0,0}) \cdot Yt + Aic_{1,1} \cdot Rw + Aic_{0,1}]^2} \tag{5}$$

$$(|U_o|)^2 = \frac{(Xt^2 + Yt^2) \cdot Us^2}{[(Arc_{1,0} \cdot Rw + Arc_{0,0}) \cdot Xt - (Aic_{1,0} \cdot Rw + Aic_{0,0}) \cdot Yt + Arc_{1,1} \cdot Rw + Arc_{0,1}]^2 \ldots + [(Aic_{1,0} \cdot Rw + Aic_{0,0}) \cdot Xt + (Arc_{1,0} \cdot Rw + Arc_{0,0}) \cdot Yt + Aic_{1,1} \cdot Rw + Aic_{0,1}]^2} \tag{6}$$

We solve (6) for $Us^2$ $$Us^2 = \frac{\begin{bmatrix} [(Arc_{1,0} \cdot Rw + Arc_{0,0}) \cdot Xt - (Aic_{1,0} \cdot Rw + Aic_{0,0}) \cdot Yt + Arc_{1,1} \cdot Rw + Arc_{0,1}]^2 \ldots + \\ [(Aic_{1,0} \cdot Rw + Aic_{0,0}) \cdot Xt + (Arc_{1,0} \cdot Rw + Arc_{0,0}) \cdot Yt + Aic_{1,1} \cdot Rw + Aic_{0,1}]^2 \end{bmatrix} \cdot (|U_o|)^2}{(Xt^2 + Yt^2)} \tag{6a}$$

and substitute (6a) in (4) and (5)

$$(|U_i|)^2 = \frac{[(Arc_{0,0} \cdot Xt - Aic_{0,0} \cdot Yt + Arc_{0,1})^2 + (Aic_{0,0} \cdot Xt + Arc_{0,0} \cdot Yt + Aic_{0,1})^2] \cdot (|U_o|)^2}{Xt^2 + Yt^2} \tag{7}$$

$$(|U_c|)^2 = \frac{[(Ar2_{0,0} \cdot Xt - Ai2_{0,0} \cdot Yt + Ar2_{0,1})^2 + (Ai2_{0,0} \cdot Xt + Ar2_{0,0} \cdot Yt + Ai2_{0,1})^2] \cdot (|U_o|)^2}{Xt^2 + Yt^2} \tag{8}$$

(7) and (8) can be written in the form $$\left[ Xt - \frac{Re(Ac_{0,0} \cdot \overline{Ac_{0,1}})}{\left(\frac{|U_i|}{|U_o|}\right)^2 - (|Ac_{0,0}|)^2} \right]^2 + \left[ Yt + \frac{Im(Ac_{0,0} \cdot \overline{Ac_{0,1}})}{\left(\frac{|U_i|}{|U_o|}\right)^2 - (|Ac_{0,0}|)^2} \right]^2 = \left[ \frac{|Ac_{0,1}| \cdot \frac{|U_i|}{|U_o|}}{\left(\frac{|U_i|}{|U_o|}\right)^2 - (|Ac_{0,0}|)^2} \right]^2 \tag{9}$$

$$\left[ Xt - \frac{Re(A2_{0,0} \cdot \overline{A2_{0,1}})}{\left(\frac{|U_c|}{|U_o|}\right)^2 - (|A2_{0,0}|)^2} \right]^2 + \left[ Yt + \frac{Im(A2_{0,0} \cdot \overline{A2_{0,1}})}{\left(\frac{|U_c|}{|U_o|}\right)^2 - (|A2_{0,0}|)^2} \right]^2 = \left[ \frac{|A2_{0,1}| \cdot \frac{|U_c|}{|U_o|}}{\left(\frac{|U_c|}{|U_o|}\right)^2 - (|A2_{0,0}|)^2} \right]^2 \tag{10}$$

We also solve (4) for $Us^2$ and substitute in (5), resulting in $$(|U_c|)^2 = \frac{[(Ar2_{0,0} \cdot Xt - Ai2_{0,0} \cdot Yt + Ar2_{0,1})^2 + (Ai2_{0,0} \cdot Xt + Ar2_{0,0} \cdot Yt + Ai2_{0,1})^2]}{(Arc_{0,0} \cdot Xt - Aic_{0,0} \cdot Yt + Arc_{0,1})^2 + (Aic_{0,0} \cdot Xt + Arc_{0,0} \cdot Yt + Aic_{0,1})^2} \cdot (|U_i|)^2 \tag{11}$$

from which we derive $$\left[Xt + \frac{\text{Re}(Ac_{0,0} \cdot \overline{Ac_{0,1}}) \cdot \left(\frac{|U_c|}{|U_i|}\right)^2 \ldots + - \text{Re}(A2_{0,0} \cdot \overline{A2_{0,1}})}{(|Ac_{0,0}|)^2 \cdot \left(\frac{|U_c|}{|U_i|}\right)^2 - (|A2_{0,0}|)^2}\right]^2 \ldots = \left[\frac{(|Ac_{0,0}| \cdot |A2_{0,1}|)^2 \ldots +}{(|Ac_{0,1}| \cdot |A2_{0,0}|)^2 \ldots + -} \cdot \left(\frac{|U_c|}{|U_i|}\right)^2}{\left[(|Ac_{0,0}|)^2 \cdot \left(\frac{|U_c|}{|U_i|}\right)^2 - (|A2_{0,0}|)^2\right]^2}\right] + \left[Yt - \frac{\text{Im}(Ac_{0,0} \cdot \overline{Ac_{0,1}}) \cdot \left(\frac{|U_c|}{|U_i|}\right)^2 \ldots +}{(|Ac_{0,0}|)^2 \cdot \left(\frac{|U_c|}{|U_i|}\right)^2 - (|A2_{0,0}|)^2}\right]^2 \quad (12)$$

(9), (10) and (12) are in the form
$(Xt - X)^2 + (Yt - Y)^2 = R^2$
and so constitute circles on the impedance plane $$X_i := \frac{\text{Re}(Ac_{0,0} \cdot \overline{Ac_{0,1}})}{\left(\frac{|U_i|}{|U_o|}\right)^2 - (|Ac_{0,0}|)^2} \qquad X_c := \frac{\text{Re}(A2_{0,0} \cdot \overline{A2_{0,1}})}{\left(\frac{|U_c|}{|U_o|}\right)^2 - (|A2_{0,0}|)^2}$$

$$Y_i := \frac{\text{Im}(Ac_{0,0} \cdot \overline{Ac_{0,1}})}{\left(\frac{|U_i|}{|U_o|}\right)^2 - (|Ac_{0,0}|)^2} \qquad Y_c := \frac{\text{Im}(A2_{0,0} \cdot \overline{A2_{0,1}})}{\left(\frac{|U_c|}{|U_o|}\right)^2 - (|A2_{0,0}|)^2}$$

$$R_i := \left|\frac{|Ac_{0,1}| \cdot \frac{|U_i|}{|U_o|}}{\left(\frac{|U_i|}{|U_o|}\right)^2 - (|Ac_{0,0}|)^2}\right| \qquad R_c := \left|\frac{|A2_{0,1}| \cdot \frac{|U_c|}{|U_o|}}{\left(\frac{|U_c|}{|U_o|}\right)^2 - (|A2_{0,0}|)^2}\right|$$

$$X_o := \frac{\text{Re}(Ac_{0,0} \cdot \overline{Ac_{0,1}}) \cdot \left(\frac{|U_c|}{|U_i|}\right)^2 - \text{Re}(A2_{0,0} \cdot \overline{A2_{0,1}})}{(|Ac_{0,0}|)^2 \cdot \left(\frac{|U_c|}{|U_i|}\right)^2 - (|A2_{0,0}|)^2}$$

$$Y_o := \frac{\text{Im}(Ac_{0,0} \cdot \overline{Ac_{0,1}}) \cdot \left(\frac{|U_c|}{|U_i|}\right)^2 - \text{Im}(A2_{0,0} \cdot \overline{A2_{0,1}})}{(|Ac_{0,0}|)^2 \cdot \left(\frac{|U_c|}{|U_i|}\right)^2 - (|A2_{0,0}|)^2}$$

$$R_o := \left|\frac{\sqrt{\begin{array}{c}(|Ac_{0,0}| \cdot |A2_{0,1}|)^2 + (|Ac_{0,1}| \cdot |A2_{0,0}|)^2 \ldots + - \\ 2 \cdot \text{Re}(Ac_{0,0} \cdot \overline{Ac_{0,1}} \cdot \overline{A2_{0,0}} \cdot A2_{0,1})\end{array}} \cdot \frac{|U_c|}{|U_i|}}{(|Ac_{0,0}|)^2 \cdot \left(\frac{|U_c|}{|U_i|}\right)^2 - (|A2_{0,0}|)^2}\right|$$

The 2 circles must intersect in 2 points, one of which represents the terminating impedance. The following functions are useful to plot the impednace plane circles and to find the intersection of 2 circles.

Functions to plot circles $$yc(x, xo, yo, r) := \begin{bmatrix} yo + \sqrt{r^2 - (x - xo)^2} \\ yo - \sqrt{r^2 - (x - xo)^2} \end{bmatrix}$$

Find real components of intersection $$xcint(x, y, r) := \frac{\begin{bmatrix} [(x_1 - x_0)^2 + (y_1 - y_0)^2 + (r_0)^2 - (r_1)^2] \cdot (x_1 - x_0) \ldots + \\ (y_1 - y_0) \cdot \sqrt{(2 \cdot r_0 \cdot r_1)^2 - [(x_1 - x_0)^2 + (y_1 - y_0)^2 - (r_1)^2 - (r_0)^2]^2} \\ [(x_1 - x_0)^2 + (y_1 - y_0)^2 + (r_0)^2 - (r_1)^2] \cdot (x_1 - x_0) \ldots + - \\ (y_1 - y_0) \cdot \sqrt{(2 \cdot r_0 \cdot r_1)^2 - [(x_1 - x_0)^2 + (y_1 - y_0)^2 - (r_1)^2 - (r_0)^2]^2} \end{bmatrix}}{2[(x_1 + x_0)^2 + (y_1 - y_0)^2]} + x_0$$

-continued

Find both intersections on Z-plane, representing 2 possible solutions $$\text{CircInt}(x, y, r) := \begin{vmatrix} \epsilon \leftarrow \sqrt{r_0 \cdot r_1} \cdot 10^{-10} \\ C \leftarrow \text{xcint}(x, y, r) \\ \text{for } i \in 0 \ldots 1 \\ \quad \begin{vmatrix} \text{for } k \in 0 \ldots 1 \\ \quad Y^{(k)} \leftarrow \text{yc}(C_i, x_k, y_k, r_k) \\ m \leftarrow \begin{vmatrix} 0 & \text{if } (|Y_{0,0} - Y_{0,1}| < \epsilon) + (|Y_{0,0} - Y_{1,1}| < \epsilon) \\ 1 & \text{otherwise} \end{vmatrix} \\ CI_i \leftarrow C_i + j \cdot Y_{m,0} \end{vmatrix} \\ CI \end{vmatrix}$$

Figure 8:
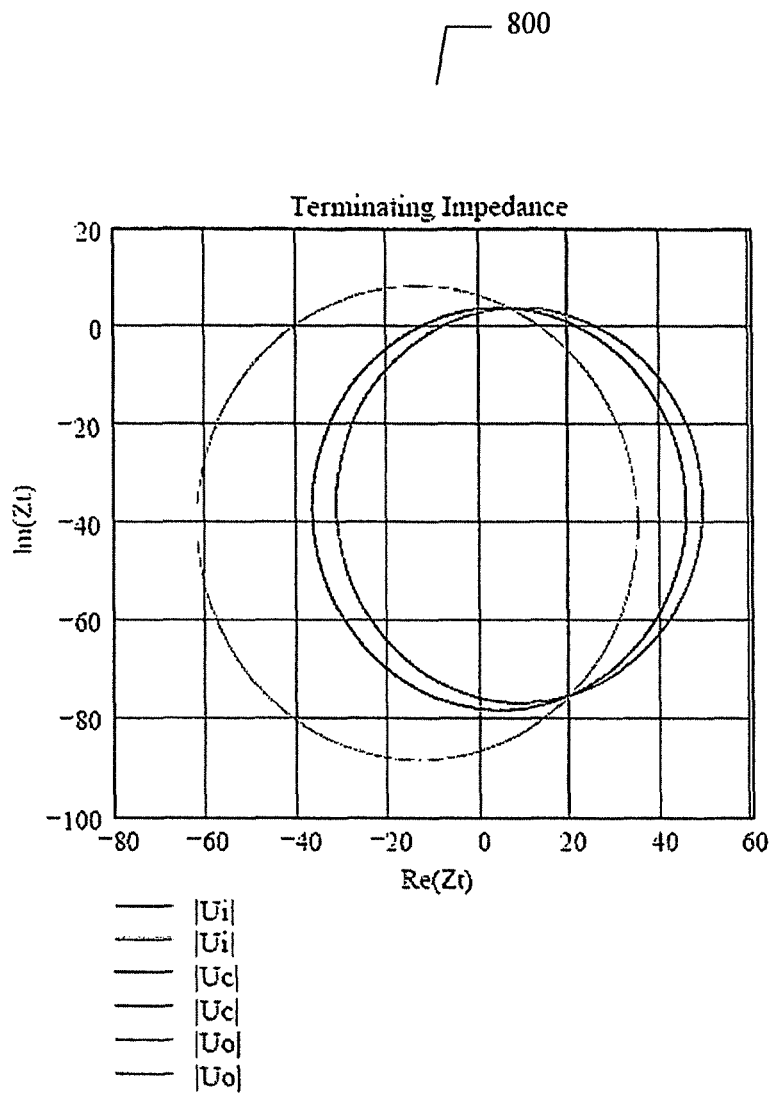
FIG. 8 depicts an illustrative embodiment of a plot of impedance circles on an impedance plane.

Looking now at FIG. 8 at 800:

We plot the circles on the impedance plane
Plot formatting
Number of samples    Ns := 2001

$U_i$ circle    $\text{Xmin}_i := X_i - R_i$    $\text{Xmax}_i := X_i + R_i$    $\Delta x_i := \dfrac{\text{Xmax}_i - \text{Xmin}_i}{1.01 \cdot (\text{Ns} - 1)}$ xi := $\text{Xmin}_i, \text{Xmin}_i + \Delta x_i \ldots \text{Xmax}_i$ $U_c$ circle    $\text{Xmin}_c := X_c - R_c$    $\text{Xmax}_c := X_c + R_c$    $\Delta x_c := \dfrac{\text{Xmax}_c - \text{Xmin}_c}{\text{Ns} - 1}$ xc := $\text{Xmin}_c, \text{Xmin}_c + \Delta x_c \ldots \text{Xmax}_c$ $U_o$ circle    $\text{Xmin}_o := X_o - R_o$    $\text{Xmax}_o := X_o + R_o$    $\Delta x_o := \dfrac{\text{Xmax}_o - \text{Xmin}_o}{\text{Ns} - 1}$ xo := $\text{Xmin}_o, \text{Xmin}_o + \Delta x_o \ldots \text{Xmax}_o$ Intersections
$$\text{CircInt}(X, Y, R) = \begin{pmatrix} 7.036 + 4.05j \\ 20 - 75j \end{pmatrix}$$

Actual impedance    Zt = 20 − 75j
Given Zt, the input impednace, or the load seen by the source $$Zi = \frac{U_i}{I_i}$$

can be computed as $$Zi := \frac{Ac_{0,0} \cdot Zt + Ac_{0,1}}{Ac_{1,0} \cdot Zt + Ac_{1,1}}$$

Zi = 0.722 + 1.618j
This can be verified by direct computation from the network elements as $$\cfrac{1}{Ym_0 + \cfrac{1}{Zm_0 + \cfrac{1}{Ym_1 + \cfrac{1}{Zm_1 + Zt}}}} = 0.722 + 1.618j$$

The variable reactive elements referred to above can be variable capacitances, variable inductances, or both. The variable capacitors can be semiconductor varactors, microelectromechanical system (MEMS) varactors, MEMS switched capacitors, and/or voltage tunable dielectric capacitors—although the present invention is not limited in this respect.

Some embodiments of the present disclosure can be implemented, for example, using a machine-readable medium or article which can store an instruction or a set of instructions that, if executed by a machine, for example, by a system of the present disclosure which includes above referenced controllers and DSPs, or by other suitable machines, cause the machine to perform a method and/or operations in accordance with embodiments of the present disclosure. Such machine can include, for example, any suitable processing platform, computing platform, computing device, processing device, computing system, processing system, computer, processor, or the like, and can be implemented using any suitable combination of hardware and/or software.

The machine-readable medium or article can include, for example, any suitable type of memory unit, memory device, memory article, memory medium, storage device, storage article, storage medium and/or storage unit, for example, memory, removable or non-removable media, erasable or non-erasable media, writeable or re-writeable media, digital or analog media, hard disk, floppy disk, Compact Disk Read Only Memory (CD-ROM), Compact Disk Recordable (CD-R), Compact Disk Re-Writeable (CD-RW), optical disk, magnetic media, various types of Digital Versatile Disks (DVDs), a tape, a cassette, or the like. The instructions can include any suitable type of code, for example, source code, compiled code, interpreted code, executable code, static code, dynamic code, or the like, and can be implemented using any suitable high-level, low-level, object-oriented, visual, compiled and/or interpreted programming language, e.g., C, C++, Java, BASIC, Pascal, Fortran, Cobol, assembly language, machine code, or the like.

An embodiment of the present disclosure provides a machine-accessible medium that provides instructions, which when accessed, cause a machine to perform operations comprising minimizing the magnitude of an input reflection coefficient seen at an RFin port under boundary conditions of a variable load impedance ZL by an adaptive antenna impedance matching module (AIMM) by using a tuner connected to said AIMM and including a plurality of voltage tunable capacitors with independent control voltages within said tuner, wherein backward-wave couplers sample incident and reflected waves respectively at the input side of said tuner; and using a microcontroller or digital signal process (DSP) chip to sample complex reflection coefficient information from said incident and reflected waves and providing by said microcontroller or DSP a coarse tune function that feeds approximate bias voltages to control said voltage tunable capacitors. The machine-accessible medium can further comprise the instructions causing the machine to perform operations further comprising sampling the complex reflection coefficient information from at least one analog to digital converter (ADC) by said microcontroller or DSP chip.

Some embodiments of the present disclosure can be implemented by software, by hardware, or by any combination of software and/or hardware as can be suitable for specific applications or in accordance with specific design requirements. Embodiments of the present disclosure can include units and/or sub-units, which can be separate of each other or combined together, in whole or in part, and can be implemented using specific, multi-purpose or general processors or controllers, or devices as are known in the art. Some embodiments of the present disclosure can include buffers, registers, stacks, storage units and/or memory units, for temporary or long-term storage of data or in order to facilitate the operation of a specific embodiment.

While the present disclosure has been described in terms of what are at present believed to be its preferred embodiments, those skilled in the art will recognize that various modifications to the disclose embodiments can be made without departing from the scope of the present disclosure as defined by the following claims.

What is claimed is:

1. An apparatus, comprising:
    a matching network adapted to reduce a magnitude of a signal reflection at a port of the matching network, wherein the matching network comprises one or more controllable variable reactive elements, and
    wherein a controller is adapted to determine reflection coefficient information from incident and reflected waves sampled at the port of the matching network, and follow at least one cycle of a coarse tune process for generating one or more control signals to tune one or more reactances of the one or more controllable variable reactive elements.

2. The apparatus of claim 1, wherein a directional coupler samples the incident and reflected waves at the port.

3. The apparatus of claim 2, wherein the controller determines the reflection coefficient information from samples provided thereto by an analog to digital converter (ADC) coupled to the directional coupler.

4. The apparatus of claim 1, wherein a look-up table is used to perform said coarse tune process.

5. The apparatus of claim 1, wherein the controller is adapted to determine new reflection coefficient information after the at least one cycle of the coarse tune process.

6. The apparatus of claim 5, wherein when a magnitude of said new reflection coefficient information has achieved a desired level, the controller is adapted to fine tune the one or more controllable variable reactive elements by applying iterative adjustments to said one or more control signals.

7. The apparatus of claim 5, wherein said fine tuning compensates for variations in manufacturing tolerances or temperature variations of the matching network.

8. The apparatus of claim 1, wherein said one or more control signals generated by the coarse tune process are supplied to a plurality of digital to analog converters (DACs) that in turn control buffers driving said one or more controllable variable reactive elements.

9. The apparatus of claim 8, wherein a DC-to-DC converter powers said buffers.

10. The apparatus of claim 1, wherein the reflection coefficient information is determined from samples supplied to the controller by at least one analog to digital converter (ADC), and wherein said one or more control signals are directed to a plurality of digital to analog converters (DACs) that in turn control said one or more controllable variable reactive elements.

11. The apparatus of claim 1, wherein said one or more controllable variable reactive elements comprise at least one of:
    one or more reactive elements controlled by one or more semiconductor devices, wherein the one or more semiconductor devices are controlled by the one or more control signals;
    one or more reactive elements controlled by one or more micro-electro-mechanical systems (MEMS) devices, wherein the one or more MEMS devices are controlled by the one or more control signals; or
    one or more reactive elements each having a controllable reactance, wherein the reactance of each of the one or more reactive elements is controlled by one of the one or more control signals.

12. The apparatus of claim 1, wherein the one or more control signals are at least one of one or more digital signals or one or more analog signals.

13. A computer-readable storage medium, comprising computer instructions to:
    determine an input reflection coefficient from incident and reflected waves detected at a port of a matching network; and
    coarse tune one or more controllable variable reactive elements of the matching network with one or more control signals determined according to the input reflection coefficient.

14. The storage medium of claim 13, comprising computer instructions to perform said coarse tune according to a lookup table that provides values corresponding to said one or more control signals.

15. The storage medium of claim 13, comprising computer instructions to:
   determine a new input reflection coefficient from an additional sampling at the port of the matching network;
   detect that the new input reflection coefficient achieves a desired level; and
   fine tune the one or more controllable variable reactive elements using iterative adjustments to said one or more control signals.

16. The storage medium of claim 13, comprising computer instructions to:
   cause an analog to digital converter to sample a signal from the port of the matching network; and
   determine the input reflection coefficient information according to the sampled signal.

17. The storage medium of claim 13, wherein said one or more controllable variable reactive elements comprise at least one of:
   one or more reactive elements controlled by one or more semiconductor devices, wherein the one or more semiconductor devices are controlled by the one or more control signals;
   one or more reactive elements controlled by one or more micro-electro-mechanical systems (MEMS) devices, wherein the one or more MEMS devices are controlled by the one or more control signals; or
   one or more reactive elements each having a controllable reactance, wherein the reactance of each of the one or more reactive elements is controlled by one of the one or more control signals.

18. A method, comprising:
   determining a reflection coefficient from a signal sampled at a port;
   determining at least one control signal from the reflection coefficient; and
   tuning a matching network with the at least one control signal, wherein the matching network comprises one or more controllable variable reactive elements each with an independent control voltage.

19. The method of claim 18, comprising tuning according to a coarse tuning process.

20. The method of claim 18, comprising tuning according to a fine tuning process.

21. The method of claim 18, wherein the one or more controllable variable reactive elements comprise at least one of:
   one or more reactive elements controlled by one or more semiconductor devices, wherein the one or more semiconductor devices are controlled by the one or more control signals;
   one or more reactive elements controlled by one or more micro-electro-mechanical systems (MEMS) devices, wherein the one or more MEMS devices are controlled by the one or more control signals; or
   one or more reactive elements each having a controllable reactance, wherein the reactance of each of the one or more reactive elements is controlled by one of the one or more control signals.

* * * * *